(12) United States Patent
Iwayama et al.

(10) Patent No.: US 8,314,464 B2
(45) Date of Patent: Nov. 20, 2012

(54) SEMICONDUCTOR DEVICE AND MANUFACTURING METHOD THEREOF

(75) Inventors: Masayoshi Iwayama, Kawasaki (JP); Yoshiaki Asao, Sagamihara (JP); Takeshi Kajiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 185 days.

(21) Appl. No.: 12/700,502

(22) Filed: Feb. 4, 2010

(65) Prior Publication Data

US 2011/0062421 A1    Mar. 17, 2011

(30) Foreign Application Priority Data

Sep. 16, 2009  (JP) .................................. 2009-214809

(51) Int. Cl.
*H01L 29/78* (2006.01)

(52) U.S. Cl. ......... 257/365; 257/E21.421; 257/E29.264; 257/29; 257/E21.409; 257/23; 438/283; 438/284

(58) Field of Classification Search .......... 257/300–326, 257/E21.21, E29.309
See application file for complete search history.

(56) References Cited

U.S. PATENT DOCUMENTS

| 7,820,551 | B2 | 10/2010 | Yagishita et al. | |
| 2005/0275010 | A1* | 12/2005 | Chen et al. | 257/315 |
| 2006/0216897 | A1* | 9/2006 | Lee et al. | 438/282 |
| 2008/0017934 | A1 | 1/2008 | Kim et al. | |
| 2008/0150043 | A1 | 6/2008 | Cha et al. | |
| 2010/0068862 | A1 | 3/2010 | Lee et al. | |
| 2011/0012201 | A1 | 1/2011 | Yagishita et al. | |
| 2011/0018053 | A1* | 1/2011 | Lo et al. | 257/325 |

FOREIGN PATENT DOCUMENTS

| JP | 2006-270107 | | 10/2006 |
| JP | 2007-311762 | A | 11/2007 |
| JP | 2008-135748 | A | 6/2008 |
| JP | 2008-172082 | A | 7/2008 |
| KR | 10-0718150 | B1 | 5/2007 |
| KR | 10-0829579 | B1 | 5/2008 |

OTHER PUBLICATIONS

Li, et al., Experimental Investigation on Superior PMOS Performance of Uniaxial Strained <110> Silicon Nanowire Channel by Embedded SiGe Source/Drain, Int. Device Mtg. IEEE 2007, pp. 899-902.
Background Art Information.
Notice of Reason for Rejection in Application No. 2009-214809 mailed Jan. 10, 2012 in eight (8) pages.

* cited by examiner

*Primary Examiner* — Mamadou Diallo
(74) *Attorney, Agent, or Firm* — Knobbe, Martens, Olson & Bear LLP

(57) ABSTRACT

First semiconductor layers are in source/drain regions on the semiconductor substrate. A second semiconductor layer comprises first portions on the first semiconductor layers and a second portion in a linear form in a channel region between the source/drain regions. A gate electrode is around the second portion of the second semiconductor layer via an insulating film. A film thickness of the second portion of the second semiconductor layer is smaller than a film thickness of the first portion of the second semiconductor layer.

7 Claims, 5 Drawing Sheets

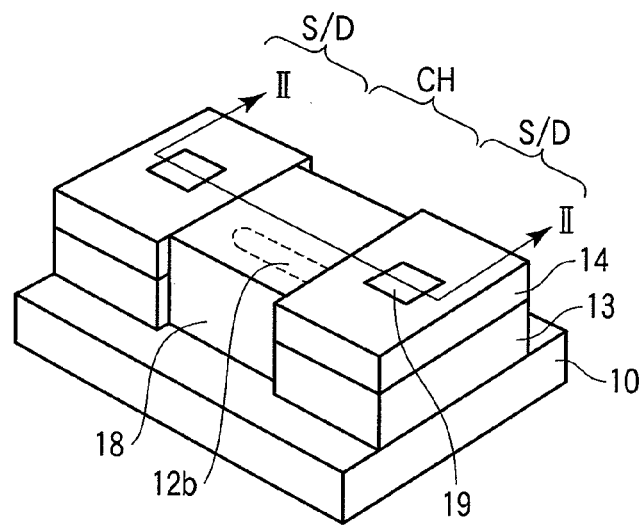
F I G. 1
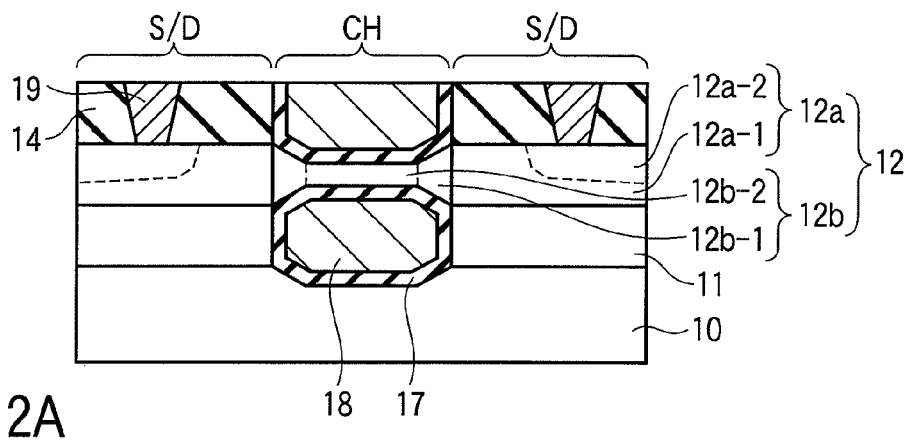
F I G. 2A
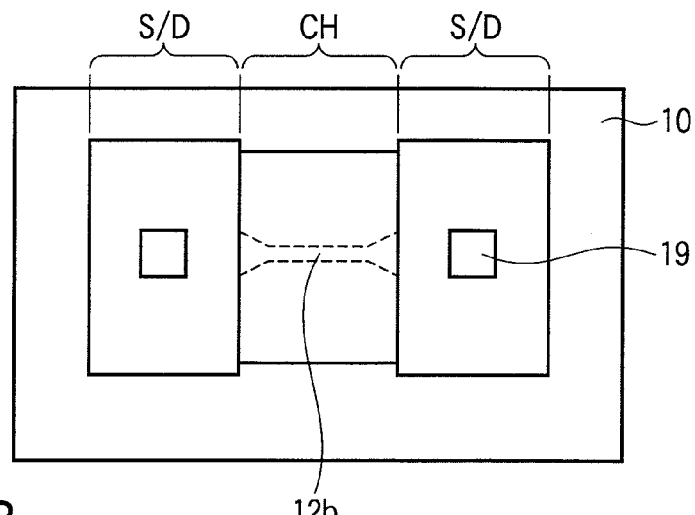
F I G. 2B

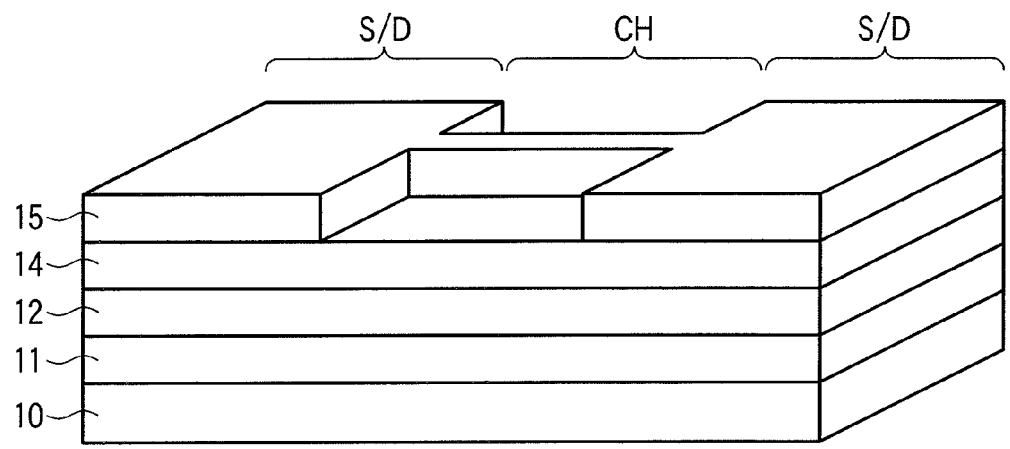
F I G. 5
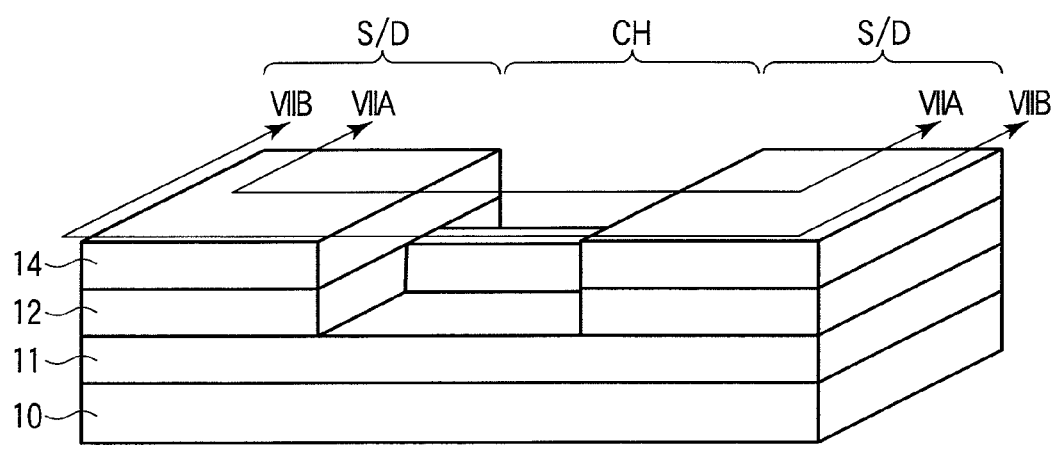
F I G. 6

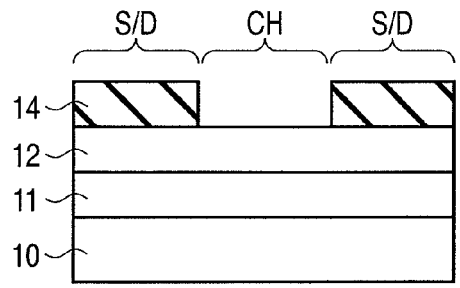
F I G. 7A
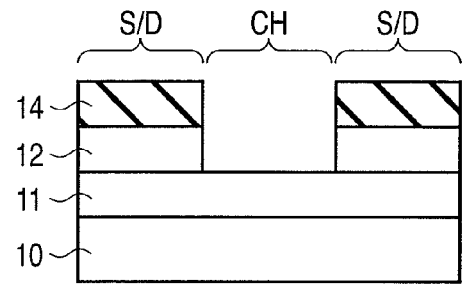
F I G. 7B
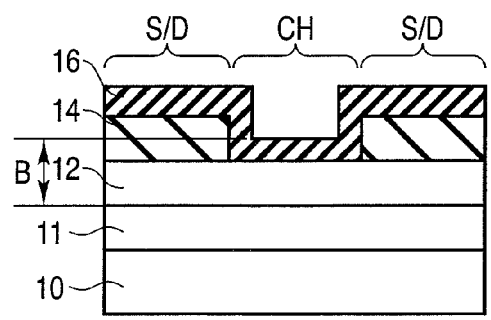
F I G. 8A
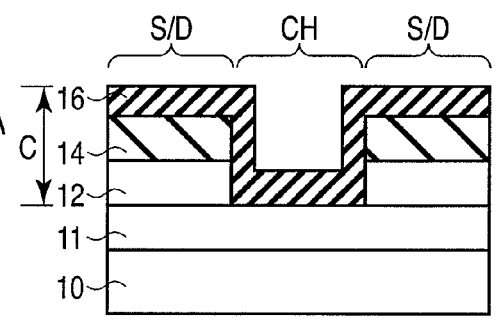
F I G. 8B
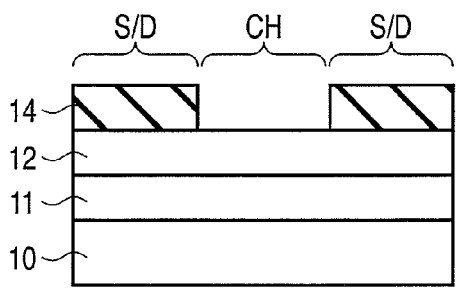
F I G. 9A
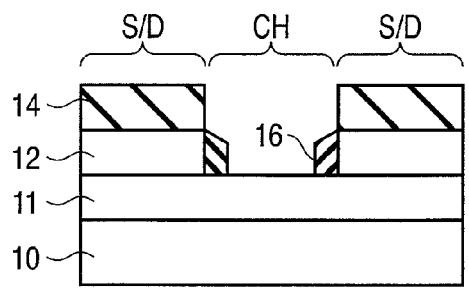
F I G. 9B

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2009-214809, filed Sep. 16, 2009, the entire contents of which are incorporated herein by reference.

BACKGROUND OF THE INVENTION

1. Field of the Invention

This invention relates to a semiconductor device comprising transistors with gate all around (GAA) structures and a manufacturing method thereof.

2. Description of the Related Art

For example, in a memory cell of a spin-transfer type MRAM, one path is used both for writing and reading. Therefore, it is required to provide a large current in the write operation and a small leak current in the read operation. That is, in the MRAM, it is desired to set a high ON/OFF ratio for the cell transistor. As a cell transistor having a high ON/OFF ratio, a gate all around (GAA) transistor is proposed (for example, see Ming Li, et al., Int. Electron Devices Meet. 2007, 899).

The GAA transistor comprises silicon (Si) films used as source-drain diffusion layers and connected via a thin silicon Si nano-wire used as a channel. A gate electrode is formed to surround the Si nano-wire. Since the GAA transistor comprises a fine Si nano-wire as a channel, it is possible to form a channel without injecting an impurity into a channel region. Therefore, ballistic transport is realized since electrons that are moving are suppressed from colliding with impurities or the like and scattering within the GAA transistor.

However, since the parasitic capacitance and parasitic resistance of the GAA transistor are high because of the fine structure, the operation speed and drive current may be degraded. For example, if the Si nano-wire is miniaturized, the Si film used as the diffusion layer is also made fine (thin). As a result, the resistance of the diffusion layer portion increases and the parasitic resistance becomes high. Accordingly, the drive current of the transistor is reduced due to the high parasitic resistance.

BRIEF SUMMARY OF THE INVENTION

According to an aspect of the first invention, there is provided, a semiconductor device comprising: a semiconductor substrate; first semiconductor layers in source/drain regions on the semiconductor substrate; a second semiconductor layer comprising first portions on the first semiconductor layers and a second portion in a linear form in a channel region between the source/drain regions; and a gate electrode around the second portion of the second semiconductor layer via an insulating film; wherein a film thickness of the second portion of the second semiconductor layer is smaller than a film thickness of the first portion of the second semiconductor layer.

According to an aspect of the second invention, there is provided, a semiconductor device manufacturing method comprising: forming a first semiconductor layer on a semiconductor substrate; forming a second semiconductor layer on the first semiconductor layer; forming source/drain regions comprising the first and second semiconductor layers and a channel formation region between the source/drain regions comprising the first and second semiconductor layers by processing the second semiconductor layer; forming a linear channel region comprising the second semiconductor layer by removing the first semiconductor layer in the channel formation region; oxidizing the surface of the second semiconductor layer in the channel region; removing the surface of the second semiconductor layer oxidized in the channel region to make a film thickness of the second semiconductor layer in the channel region smaller than that of the second semiconductor layer in the source/drain region; and forming a gate electrode around the second semiconductor layer in the channel region via an insulating film.

BRIEF DESCRIPTION OF THE SEVERAL VIEWS OF THE DRAWING

FIG. 1 is a perspective view showing the structure of a GAA transistor according to one embodiment of this invention.

FIG. 2A is a cross-sectional view along the line II-II of FIG. 1, for illustrating the structure of the GAA transistor according to one embodiment of this invention.

FIG. 2B is a plan view showing the structure of the GAA transistor according to one embodiment of this invention.

FIG. 5 and FIG. 6 are perspective views showing the manufacturing steps of the GAA transistor according to one embodiment of this invention.

FIG. 7A is a cross-sectional view along line VIIA-VIIA of FIG. 6.

FIG. 7B is a cross-sectional view along line VIIB-VIIB of FIG. 6.

FIG. 8A is a cross-sectional view showing a manufacturing step following the step of FIG. 7A.

FIG. 8B is a cross-sectional view showing a manufacturing step following the step of FIG. 7B.

FIG. 9A is a cross-sectional view showing a manufacturing step following the step of FIG. 8A.

FIG. 9B is a cross-sectional view showing a manufacturing step following the step of FIG. 8B.

DETAILED DESCRIPTION OF THE INVENTION

Figure 3:
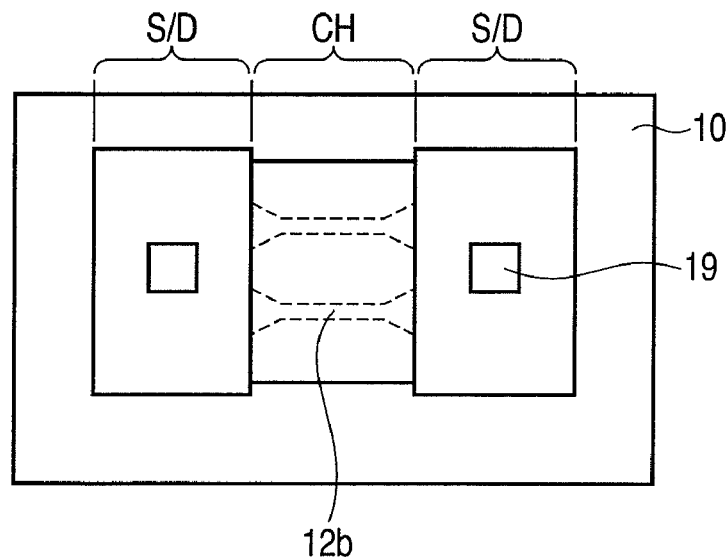
FIG. 3 is a plan view showing a modification of the GAA transistor according to one embodiment of this invention.

An embodiment of this invention will be explained below with reference to the accompanying drawings. In the drawings, the same reference symbols are attached to common portions.

<Structure>

First, the structure of a GAA transistor according to an embodiment of this invention is explained. FIG. 1 is a perspective view showing the GAA transistor.

As shown in FIG. 1, the GAA transistor includes source/drain regions S/D and a channel region CH.

The source/drain regions S/D are formed with a certain distance therebetween on a semiconductor substrate 10. For example, stacked films 13 each comprising a silicon germanium (SiGe) film (not shown) and a silicon (Si) film (not shown) are formed in the respective source/drain regions S/D. The Si film comprises an impurity diffusion layer and acts as the source/drain region. Oxide films ($SiO_2$ films) 14 are respectively formed on the stacked films 13. Contact plugs 19 are formed in the central portions in the source/drain regions S/D in the $SiO_2$ films 14 and stacked films 13.

The channel region CH is formed between the two source/drain regions S/D on the semiconductor substrate 10. A wire-form Si film (Si nano-wire) 12b is formed in the channel region CH. The Si nano-wire 12b acts as a channel, and therefore, the two source/drain regions S/D are electrically connected to each other. That is, the Si nano-wire 12b is formed continuously from the Si films of the stacked films 13 in the source/drain region S/D. A gate electrode 18 is formed around the Si nano-wire 12b via a gate insulating film (not shown).

FIG. 2A is a cross-sectional view taken along the line II-II of FIG. 1. FIG. 2B is a plan view showing the GAA transistor shown in FIG. 1.

As shown in FIG. 2A, the GAA transistor according to this embodiment comprises two source/drain regions S/D and a channel region CH that connects the source/drain regions S/D.

In each of the source/drain regions S/D, an SiGe film 11, Si film 12a, oxide film 14 and contact plug 19 are formed.

The SiGe film 11 is formed on the semiconductor substrate 10. On the SiGe film 11, the Si film 12a is formed. The Si film 12a comprises an $N^-$-type region 12a-1 connected to the channel, and an $N^+$-type region 12a-2 connected to the contact plug 19, for example.

The oxide film 14 is formed on each Si film 12a. The contact plug 19 that is electrically connected to the $N^+$-type region 12a-2 of the Si film 12a is formed in each oxide film 14.

In the channel region CH, the Si film 12b, gate insulating films 17 and gate electrodes 18 are formed.

The Si film 12b is formed at the same level as the Si film 12a. Further, as shown in FIG. 2B, the Si film 12b is formed in a wire form (that is hereinafter referred to as an Si nano-wire 12b). As will be described later, the Si nano-wire 12b is the same film as the Si film 12a and electrically connects the Si films 12a in the two source/drain regions S/D. That is, the Si films 12a and Si nano-wire 12b are combined to configure the Si film 12.

Further, the film thickness of the Si nano-wire 12b is smaller than that of the Si film 12a. That is, the Si film 12 is formed to set the film thickness of the Si film 12 in the channel region CH smaller than that of the Si film 12 in the source/drain region S/D. At this time, it is preferable to set the film thickness of the Si nano-wire 12b to several nm, for example, and set the film thickness of the Si film 12a from 10 nm to 100 nm, for example. As a result, ballistic transport of the Si nano-wire 12b can be realized and the parasitic resistance of the Si film 12a can be sufficiently reduced.

In this case, the Si nano-wire 12b comprises an $N^-$-type region 12b-1 formed near the end portion, for example, and intrinsic semiconductor regions 12b-2 functioning as a channel. It is sufficient if the film thickness of the intrinsic semiconductor regions 12b-2 functioning as the channel is set smaller than that of the Si film 12a.

In order to uniformly apply an electric field to the entire portion of the Si nano-wire 12b, it is preferable to form the Si nano-wire 12b in a cylindrical form. In this case, the diameter of the Si nano-wire 12b is set smaller than the film thickness of the Si film 12 in the source/drain region S/D.

The gate insulating film 17 is formed on the entire peripheral surface of the Si nano-wire 12b. The gate electrode 18 is formed on the entire peripheral surface of the gate insulating film 17. That is, the entire peripheral surface of the Si nano-wire 12b is covered with the gate electrode 18 via the gate insulating film 17.

Figure 4:
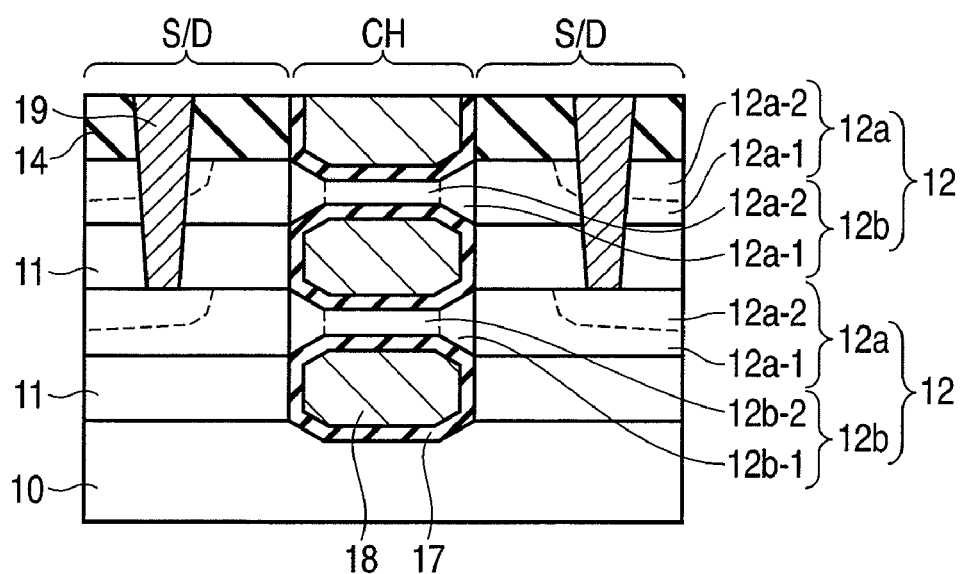
FIG. 4 is a cross-sectional view showing a modification of the GAA transistor according to one embodiment of this invention.

In FIG. 2, a case wherein one Si nano-wire 12b is formed for the two source/drain regions S/D is shown as an example. However, as shown in FIG. 3, plural Si nano-wires may be formed in a plane (in the same Si film) parallel to the semiconductor substrate 10. Further, as shown in FIG. 4, plural Si nano-wires may be formed in a direction perpendicular to the semiconductor substrate 10 by laminating a plurality of layers of SiGe films 11 and Si films 12.

<Manufacturing Method>

Next, a manufacturing method of the GAA transistor according to the embodiment of this invention is explained. FIG. 5 and FIG. 6 are perspective views showing the manufacturing steps of the GAA transistor.

First, as shown in FIG. 5, an SiGe film 11 and Si film 12 are sequentially formed on a semiconductor substrate 10. For example, the SiGe film 11 and Si film 12 are formed by an epitaxial growth method. Next, an $SiO_2$ film 14 is formed on the Si film 12. A resist pattern 15 corresponding to an Si nano-wire that will be formed later is formed on the $SiO_2$ film 14 by lithography. Although not shown in the drawing, an impurity ion is injected into portions extending from the source/drain regions to regions near the end portions in the channel region after the Si film 12 is formed.

Subsequently, as shown in FIG. 6, the resist pattern 15 is transferred to the $SiO_2$ film 14 and the resist pattern 15 is removed. For example, the Si film 12 is processed by a reactive ion etching (RIE) process with the $SiO_2$ film 14 used as a hard mask. As a result, the Si film 12 in the channel region CH is formed into a wire form. At this time, the SiGe film 11 in the channel region CH may be processed by the RIE process. After this, the $SiO_2$ film 14 in the channel region CH is removed.

FIG. 7A is a sectional view along line VIIA-VIIA of FIG. 6, and FIG. 7B is a sectional view along line VIIB-VIIB of FIG. 6.

As shown in FIG. 7A, the Si film 12 like a wire is formed in the channel region CH in the cross section (channel cross section) taken along the line VIIA-VIIA. On the other hand, as shown in FIG. 7B, the Si film 12 is not formed in the channel region CH in the cross section (non-channel cross section) taken along the line VIIB-VIIB.

FIG. 8A to FIG. 12A are sectional views showing the manufacturing steps of the GAA transistor following the step of FIG. 7A. FIG. 8B to FIG. 12B are sectional views showing the manufacturing steps of the GAA transistor following the step of FIG. 7B.

As shown in FIG. 8A and FIG. 8B, an SiN film 16 is formed on the entire surface after the Si film 12 is processed. At this time, the SiN film 16 is formed so that the film thickness A of the SiN film 16 on the Si film 12 in the channel region CH and the film thickness B of the SiN film 16 (the film thickness in a direction perpendicular to the substrate 10) on the side surface of the Si film 12 (the side surface of the Si nano-wire) in the channel region CH in the channel cross section may be set smaller than the film thickness C of the SiN film 16 (the film thickness in a direction perpendicular to the substrate 10) on the side surfaces of the $SiO_2$ film 14 and Si film 12 in the non-channel cross section.

Next, as shown in FIG. 9A and FIG. 9B, portions of the SiN film 16 other than the side surface portions of the Si film 12 are removed by etching-back. The SiN film 16 is selectively left behind only on the side surfaces of the Si films 12 in the source/drain regions S/D by adjusting the film thickness of the $SiO_2$ film 14 and controlling the film thicknesses A, B, C. Thus, the upper and side surfaces of the Si nano-wire are exposed.

Figure 10A:
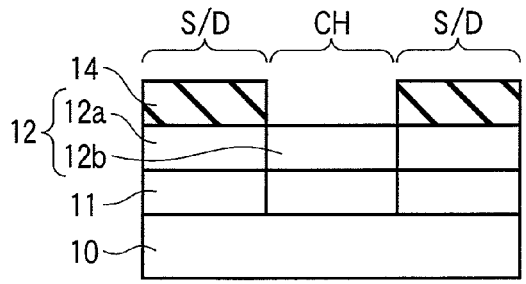
FIG. 10A is a cross-sectional view showing a manufacturing step following the step of FIG. 9A.
Figure 10B:
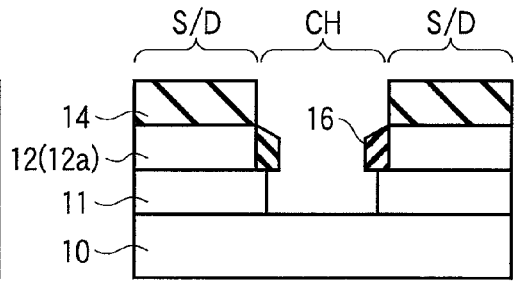
FIG. 10B is a cross-sectional view showing a manufacturing step following the step of FIG. 9B.

Next, as shown in FIG. 10A and FIG. 10B, the SiGe film 11 in the channel region CH is removed by using a chemical liquid having a high selectivity ratio with respect to the SiGe film 11. As the chemical liquid, a gas containing chlorine trifluoride (ClF3), for example, is used in the case of dry-etching and hydrofluoric nitric acid, for example, is used in the case of wet-etching. As a result, the entire peripheral surface of the Si film 12 in the channel region CH is exposed and an Si nano-wire 12b is formed.

Subsequently, the surface of the Si nano-wire 12b may be annealed in an $H_2$ atmosphere of approximately 800° C., for example. Thus, the Si nano-wire 12b is formed in a cylindrical form. In this case, it is preferable to set the film thickness and width (the width in a direction perpendicular to the drawing sheet) of the Si nano-wire 12b to substantially the same value by adjusting the resist pattern 15.

Figure 11A:
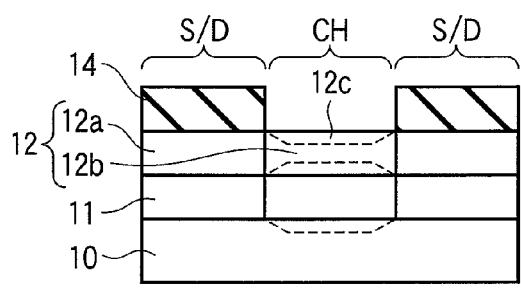
FIG. 11A is a cross-sectional view showing a manufacturing step following the step of FIG. 10A.
Figure 11B:
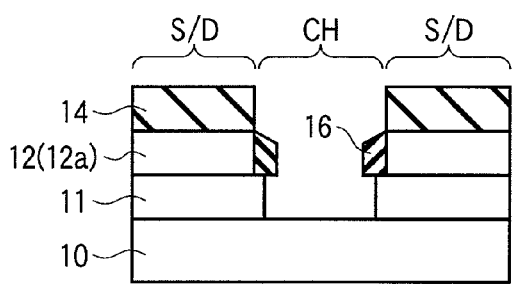
FIG. 11B is a cross-sectional view showing a manufacturing step following the step of FIG. 10B.

Next, as shown in FIG. 11A and FIG. 11B, the entire peripheral surface of the Si nano-wire 12b is oxidized by performing heat treatment in an oxygen atmosphere. At this time, the side surfaces of the Si films 12 (Si films 12a) in the source/drain regions S/D can be prevented from being oxidized because the SiN film 16 has been formed. That is, only the surface of the Si film 12 (Si nano-wire 12b) in the channel region is oxidized. As a result, an $SiO_2$ film 12c is formed on the surface of the Si nano-wire 12b.

Figure 12A:
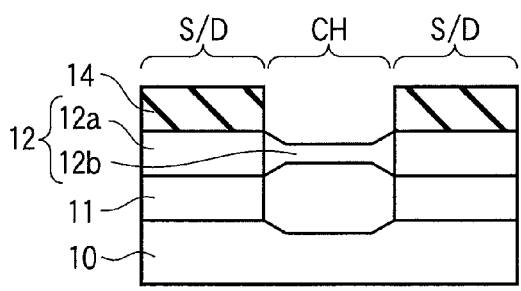
FIG. 12A is a cross-sectional view showing a manufacturing step following the step of FIG. 11A.
Figure 12B:
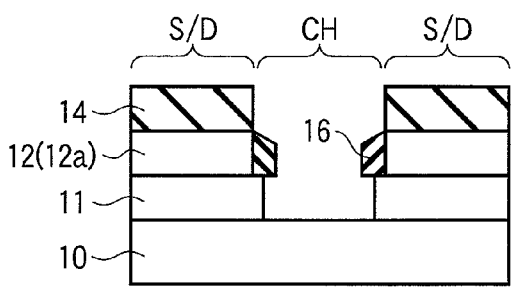
FIG. 12B is a cross-sectional view showing a manufacturing step following the step of FIG. 11B.

Next, as shown in FIG. 12A and FIG. 12B, the $SiO_2$ film 12c on the surface of the Si nano-wire 12b is removed by using a chemical liquid having a high selectivity ratio with respect to the $SiO_2$ film 12c. As the chemical liquid, for example, diluted hydrofluoric acid (DHF) is used. As a result, the surface portion of the Si nano-wire 12b is slimmed to make the film thickness of the Si nano-wire 12b smaller than that of the Si film 12a. That is, the film thickness of the Si film 12 in the channel region CH is made smaller than that of the Si film 12 in the source/drain region S/D. In this case, if the Si nano-wire 12b is formed in a cylindrical form, the diameter of the Si nano-wire 12b becomes smaller than the film thickness of the Si film 12a.

Next, as shown in FIG. 2A, a gate insulating film 17 is formed on the entire peripheral surface of the Si nano-wire 12b. For example, the gate insulating film 17 is an oxide film. A gate electrode 18 is formed on the gate insulating film 17 by a chemical vapor deposition (CVD) method, for example. As a result, the gate electrode 18 is formed on the entire peripheral surface of the Si nano-wire 12b via the gate insulating film 17. Subsequently, contact plugs 19 each formed of a titanium film, tungsten film or a stacked film thereof are formed in the oxide films 14 in the source/drain regions S/D.

<Effect>

According to this embodiment, the film thickness of the Si film 12 (Si nano-wire 12b) in the channel region is smaller than that of the Si film 12 (Si film 12a) in the source/drain region S/D. That is, the film thickness of the Si film 12a is kept at a certain value with respect to the miniaturized Si nano-wire 12b. Thus, by reducing the film thickness of the Si nano-wire 12b, an electric field tends to be concentrated to the Si nano-wire 12b and ballistic transport is attained. As a result, a drive current can be increased and the function of the Si film 12 as a channel can be enhanced. Further, by increasing the film thickness of the Si film 12a with respect to the miniaturized Si nano-wire 12b, the resistance in the source/drain region S/D (diffusion layer portion) can be reduced and the parasitic capacitance can be reduced. That is, in this embodiment, the ballistic transport of the channel can be enhanced and the parasitic resistance the source/drain region can be reduced.

According to the manufacturing method of this embodiment, the entire peripheral surface portion of the Si nano-wire 12b is slimmed by oxidizing the entire peripheral surface of the Si nano-wire 12b. As a result, not only the film thickness of the Si nano-wire 12b but also the area of the entire peripheral surface thereof can be made small. Therefore, ballistic transport can be more effectively realized in comparison with a case wherein only the film thickness is reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a semiconductor substrate comprising two source/drain regions and a channel region between the source/drain regions;
   one or more first semiconductor layers in the source/drain regions;
   a second semiconductor layer on the first semiconductor layers, the second semiconductor layer comprising first portions in the source/drain regions and a second portion in a linear form in the channel region; and
   a gate electrode around the second portion of the second semiconductor layer via an insulating film;
   wherein a film thickness of the second portion of the second semiconductor layer is smaller than a film thickness of the first portion of the second semiconductor layer, and
   wherein a film thickness of an end portion of the second portion gradually decreases from the first portion.

2. The device of claim 1, wherein the second portion of the second semiconductor layer is formed in a cylindrical form and a diameter of the second portion of the second semiconductor layer is smaller than the film thickness of the first portion of the second semiconductor layer.

3. The device of claim 2, wherein the diameter of the second portion of the second semiconductor layer is several nanometers (nm) and the film thickness of the first portion of the second semiconductor layer ranges from 10 nm to 100 nm.

4. The device of claim 1, further comprising an oxide film on the second portion of the second semiconductor layer.

5. The device of claim 1, wherein the first semiconductor layer is a silicon-germanium (SiGe) film and the second semiconductor layer is a silicon (Si) film.

6. The device of claim 1, wherein the second semiconductor layer comprises the plural second portions that are formed in a plane parallel to the semiconductor substrate.

7. The device of claim 1, further comprising:
one or more third semiconductor layers on the first portions of the second semiconductor layer and comprising the same material as the first semiconductor layer; and
a fourth semiconductor layer on the third semiconductor layers, the fourth semiconductor layer comprising third portions in the source/drain regions and a fourth portion in a linear form in the channel region and comprising the same material as the second semiconductor layer;
wherein the gate electrode is around the fourth portion of the fourth semiconductor layer via an insulating film and film thickness of the fourth portion of the fourth semiconductor layer is smaller than that of the third portion of the fourth semiconductor layer.

* * * * *